(12) United States Patent
Nikawa

(10) Patent No.: US 7,825,673 B2
(45) Date of Patent: Nov. 2, 2010

(54) FAILURE ANALYSIS METHOD AND FAILURE ANALYSIS APPARATUS

(75) Inventor: Kiyoshi Nikawa, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 137 days.

(21) Appl. No.: 12/164,437

(22) Filed: Jun. 30, 2008

(65) Prior Publication Data
US 2009/0002000 A1 Jan. 1, 2009

(30) Foreign Application Priority Data
Jun. 29, 2007 (JP) ............... 2007-172554

(51) Int. Cl.
*G01R 31/02* (2006.01)
*G01R 31/302* (2006.01)
(52) U.S. Cl. .................. 324/750; 324/96; 324/751; 324/752; 324/501; 250/492.2
(58) Field of Classification Search ......... 324/750–765; 250/492.2
See application file for complete search history.

(56) References Cited

U.S. PATENT DOCUMENTS

| 6,444,895 | B1 | 9/2002 | Nikawa | |
|---|---|---|---|---|
| 6,549,022 | B1* | 4/2003 | Cole et al. | 324/752 |
| 6,593,156 | B2* | 7/2003 | Nikawa | 438/17 |
| 6,653,851 | B2* | 11/2003 | Cugini et al. | 324/752 |
| 6,967,491 | B2* | 11/2005 | Perdu et al. | 324/752 |
| 7,015,051 | B2 | 3/2006 | Shiba | |
| 7,062,399 | B1* | 6/2006 | Bruce et al. | 702/117 |
| 2003/0109787 | A1 | 6/2003 | Black | |
| 2005/0140367 | A1* | 6/2005 | Nikawa | 324/248 |

FOREIGN PATENT DOCUMENTS

| EP | 0 990 918 | 4/2000 |
|---|---|---|
| EP | 1 498 727 | 1/2005 |
| EP | 1 528 400 | 5/2005 |
| JP | 2006-258479 | 9/2006 |

OTHER PUBLICATIONS

N Kiyoshi et al., Measurement from Chip Back Surface by IR_OBIRCH Method, NEC Technical Report, NEC Corporation, 1997, vol. 50, No. 6, p. 68-73.

* cited by examiner

*Primary Examiner*—Ha Tran T Nguyen
*Assistant Examiner*—Emily Y Chan
(74) *Attorney, Agent, or Firm*—Young & Thompson

(57) ABSTRACT

Failure analysis method includes performing fixed radiation of semiconductor chip (wafer) by photocurrent generation laser beam, scanning and radiating a region to be observed on semiconductor chip by heating laser beam, detecting, by a SQUID fluxmeter, current change generated in the semiconductor chip by radiating the photocurrent generation laser beam and the heating laser beam, and analyzing failure of the semiconductor chip based on current change detected by the SQUID fluxmeter. Radiation of photocurrent generation laser beam and heating laser beam are performed from a back surface side of the LSI chip, and detection by the SQUID fluxmeter is performed on a front surface side of the LSI chip. In analysis of failure of the LSI chip, image processing is performed in which a signal outputted from the SQUID fluxmeter is made to correspond to a scanning point. Visualization of defects is possible.

19 Claims, 5 Drawing Sheets

FIG.1
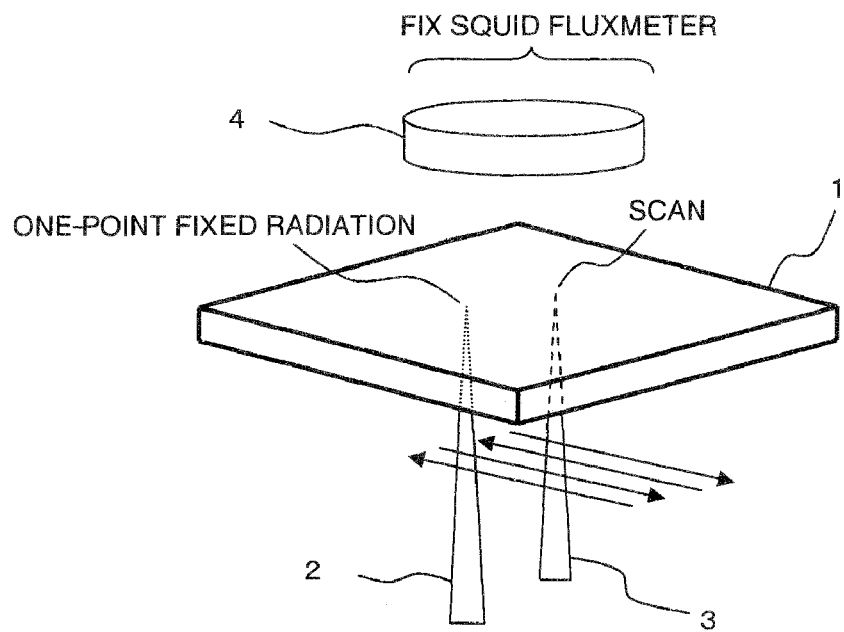
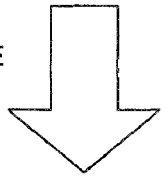
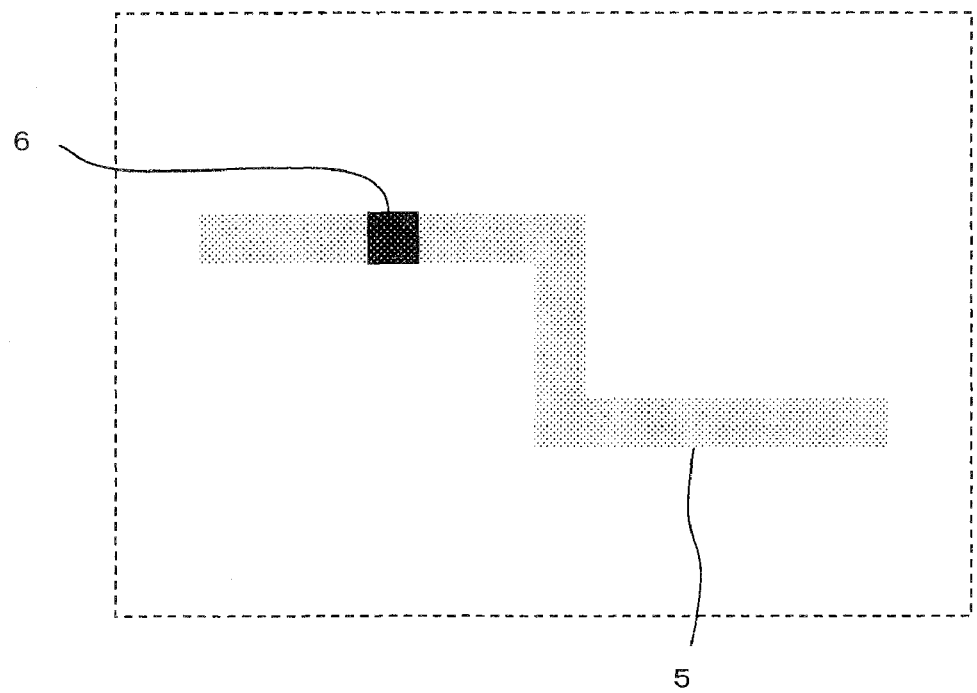

FIG.4
RELATED ART
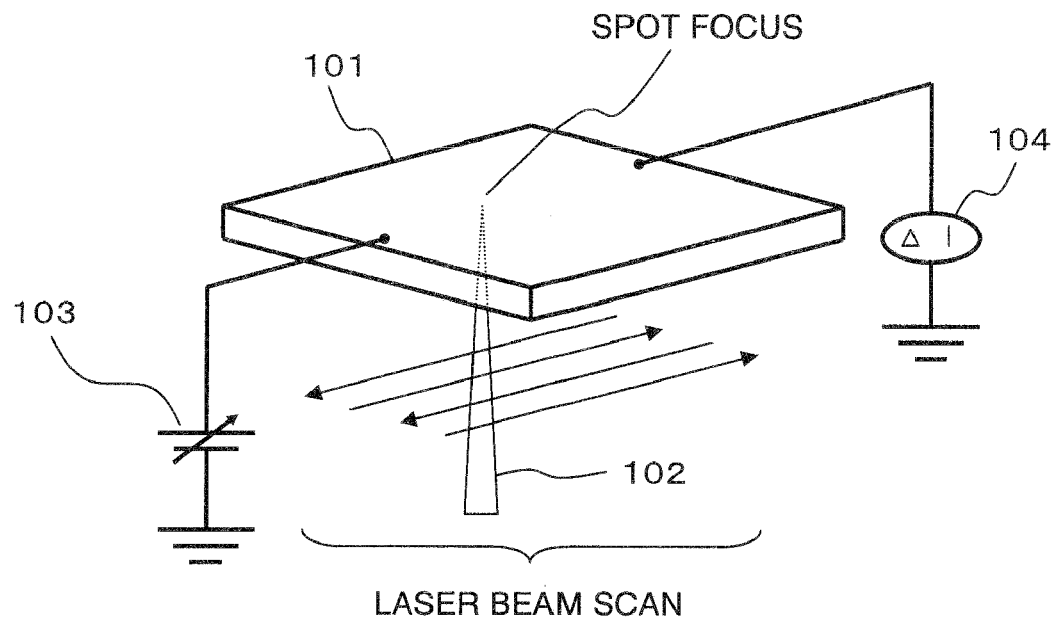
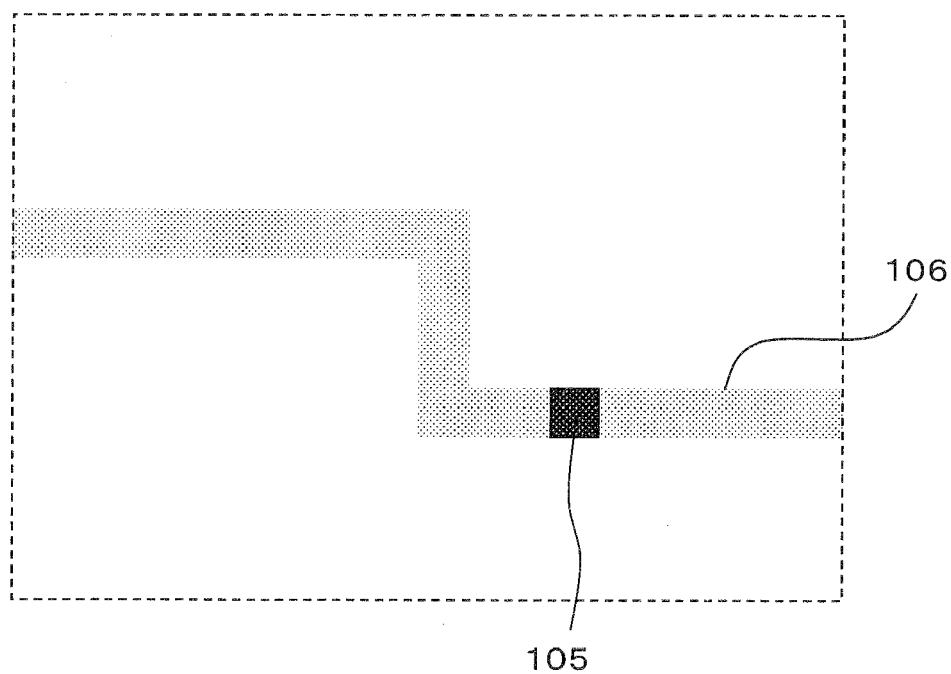

FIG.5
RELATED ART
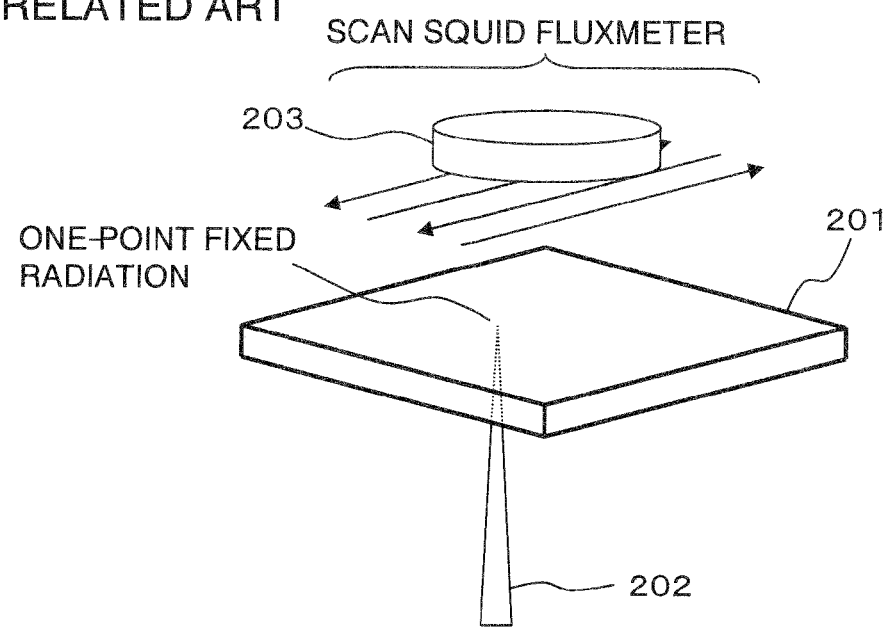
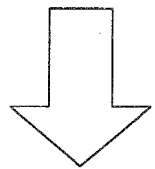
OBTAIN SCAN IMAGE, PERFORM FOURIER TRANSFORM
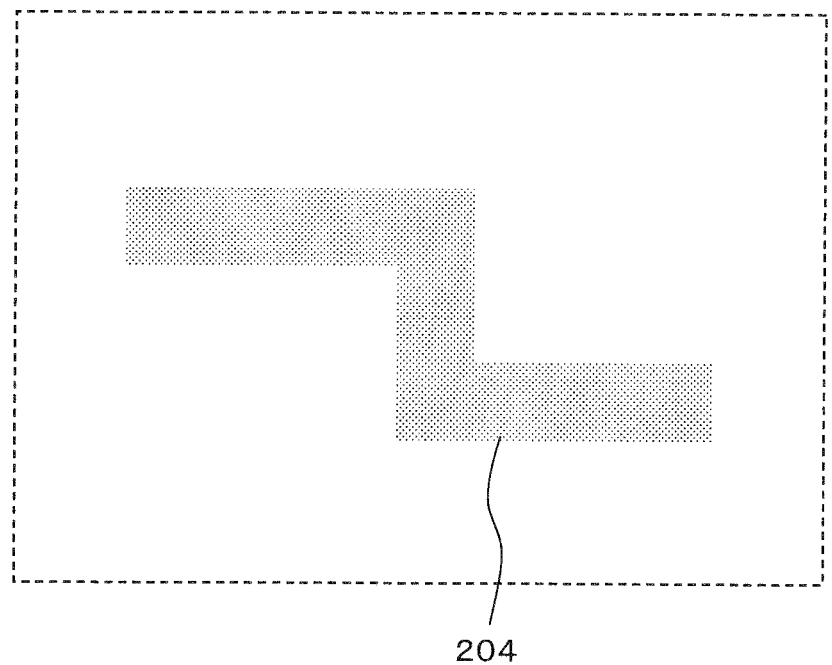

FAILURE ANALYSIS METHOD AND FAILURE ANALYSIS APPARATUS

REFERENCE TO RELATED APPLICATION

This application is based upon and claims the benefit of the priority of Japanese patent application No. 2007-172554, filed on Jun. 29, 2007, the disclosure of which is incorporated herein in its entirety by reference thereto.

TECHNICAL FIELD

This invention relates to a failure analysis method and a failure analysis apparatus in which failure of a semiconductor chip or wafer is analyzed, and in particular, to a failure analysis method and a failure analysis apparatus which non-destructively focus on failure locations on the semiconductor chip.

BACKGROUND

A failure analysis method and apparatus are used for identifying a failure location on a semiconductor chip such as an LSI chip or the like, and for determining a cause of the failure. A procedure for failure analysis is broadly divided into two. First, a location suspected of failure on a semiconductor chip is focused upon, to the order of microns. Then, the location focused upon is physicochemically destructively analyzed. The following disclosures describe conventional technology related to failure analysis methods and apparatuses of this type.

Conventional Example 1 discloses technology as schematically shown in FIG. 4 (refer, for example, to Non-Patent Document 1, FIG. 3). In a state in which a current flows from a constant voltage source 103 between 2 terminals of an LSI chip 101, an area to be observed is scanned in a state in which a heating laser beam 102 is focused close to a surface of the LSI chip 101. Since the heating laser beam 102 is often radiated from the back side of the LSI chip 101, the drawing is also arranged in that way. When the heating laser beam 102 radiates on a current path (corresponding to 106) on the LSI chip 101, the temperature of wiring at a location thereof rises and wiring resistance changes, so that this change can be detected by a current change detection measuring device 104. By displaying an output signal of the current change detection measuring device 104 as a scan image, visualization of the current path 106 is possible. If there is a defect 105 in the wiring, since the extent of temperature rise is different from locations without the defect 105, a contrast is obtained in the scan image. Using this type of Conventional Example 1, it is possible to visualize the current path 106 on the LSI chip 101 and the defect 105 on the current path 106. Since spatial resolution of the scan image by this method is determined by the diameter of the heating laser beam 102, at maximum, submicron resolution can be obtained.

Conventional Example 2 discloses technology as shown in FIG. 5 (refer, for example, to Patent Document 1). A SQUID fluxmeter 203 is a magnetic sensor with the highest sensitivity at present. When an LSI chip 201 is radiated close to a surface thereof by a photocurrent generation laser beam 202, there is a location in the LSI chip 201 at which photocurrent is generated. The location at which the photocurrent is generated is at and in a vicinity of a location at which there is p-n junction or an impurity concentration difference. When the photocurrent is generated, a magnetic field is generated. This magnetic field is detected by the SQUID fluxmeter 203. The SQUID fluxmeter 203 scans in an area to be observed in a state in which the photocurrent generation laser beam 202 is radiated in a fixed manner at a location at which the photocurrent is generated, and a scan image is obtained. The obtained scan image shows magnetic field distribution, and by a Fourier transform thereof a current distribution image is obtained. "SQUID" is an abbreviation of "Superconducting Quantum Interference Device".

[Patent Document 1]
JP Patent Kokai Publication No. JP-P2006-258479A

[Non-Patent Document 1]
Measurement from Chip Back Surface by IR-OBIRCH Method, Nikawa, Kiyoshi, and Inoue, Shoji, NEC Technical Report, NEC Corporation, 1997, Vol. 50, No. 6, p. 68-73.

SUMMARY OF THE DISCLOSURE

The entire disclosures of Patent Document 1 and Non-Patent Document 1 are incorporated herein by reference thereto. The following analyses are given by the present invention.

However, in Convention Example 1 (refer to FIG. 4), it is very difficult to make a current flow in wiring targeting internal parts of the LSI chip 101. The reason for this is that in Conventional Example 1, it is necessary to have a connection to outside the LSI chip 101 by 2 terminals. That is, a current flows with a constant voltage source 103, and the 2-terminal outside connection is necessary for detecting current change by the current change detection measuring device 104. In actuality, the LSI chip 101 has at most several thousand terminals that can be connected to the outside. On the other hand, the number of wires inside the LSI chip 101 is from several tens of thousands to several hundred million. As a result, it is very difficult to flow a current in an arbitrary wire inside the LSI chip 101 using only external terminals of the LSI chip 101.

Furthermore, in Conventional Example 1, application is very difficult during the manufacturing process of the LSI chip 101. That is, since pad electrodes for connecting terminals to the outside are not formed during the manufacturing process of the LSI chip 101, application to Conventional Example 1 is very difficult.

In Conventional Example 2 (refer to FIG. 5), connection of an LSI chip 201 to the outside is not necessary, but spatial resolution of the current path 204 is of the order of several tens of microns, which is not good. The reason that the spatial resolution is not good is that the spatial resolution of a scan image is determined by the larger of "size of SQUID element" and "distance between LSI chip and SQUID element". That is, an element having a central function of the SQUID fluxmeter 203 is the SQUID element which is a part that detects a magnetic field, and it is necessary that the SQUID element be at least cooled to the order of 80 K (Kelvin). Since the LSI chip 201 is in the open air and the SQUID element is below approximately 80 K, it is very difficult for the distance between the SQUID element and the LSI chip 201 to be less than approximately several tens of microns. As a result, a spatial resolution of at maximum only several tens of microns is obtained. There is an example of reducing the size of the SQUID element to the order of several microns and obtaining a resolution of a micron order, but this is in a state in which a sample is cooled in a vacuum to reduce the distance between the SQUID element and the LSI chip, and is not practicable.

Furthermore, in Conventional Example 2, visualization of defects is not possible. The reason that visualization of defects is not possible is that there is originally no mechanism for visualization of defects in this technology.

A principal issue of the present invention is to make terminal connection to the outside unnecessary, when analyzing a failure of a semiconductor chip, and to make possible visualization of current path and defects with a spatial resolution of submicrons.

In a first aspect of the present invention, there is provided a failure analysis method of analyzing a failure of a sample (i.e., semiconductor chip or wafer). In the method fixed radiation (i.e., radiation onto a fixed point or spot) of the sample (semiconductor chip or wafer) is performed by a photocurrent generation laser beam. Scanning and radiating a region to be observed on the sample (semiconductor chip or wafer) are formed by a heating laser beam. Detecting, by a magnetic sensor, current change generated in the sample (semiconductor chip or wafer) is performed by radiating the photocurrent generation laser beam and the heating laser beam. Then analyzing a failure of the semiconductor chip or wafer is performed based on the current change detected by the magnetic sensor.

In a second aspect of the present invention, there is provided a failure analysis apparatus for analyzing a failure of a semiconductor chip or wafer. In the apparatus, a heating laser outputs a heating laser beam, and a photocurrent generation laser outputs a photocurrent generation laser beam. An optical system outputs a mixed (or combined) laser beam, in which the photocurrent generation laser beam and the heating laser beam that have been inputted are mixed, towards a back surface of a sample formed from a semiconductor chip or wafer. A magnetic sensor detects, at a front surface side of the sample, a magnetic field produced by a current generated by the sample by radiation of the mixed laser beam. The optical system outputs position, based on a control signal, and performs fixed radiation (i.e., radiation onto a fixed point or spot) onto the back surface of the sample, of the photocurrent generation laser beam of the mixed (or combined) laser beam, and while scanning, based on a control signal, radiates onto the back surface of the sample the heating laser beam of the mixed laser beam.

The meritorious effects of the present invention are summarized as follows.

According to the present invention, by flowing a current of the semiconductor chip or wafer by the photocurrent generation laser beam and detecting a current change by the magnetic sensor, terminal connection to the outside becomes unnecessary, and by scanning the heating laser beam, visualization of current path and detects at submicron spatial resolution becomes possible.

BRIEF DESCRIPTION OF THE DRAWINGS

FIG. 1 is an outline diagram schematically showing a failure analysis method according to Exemplary Embodiment 1 of the present invention.

FIG. 4 is an outline diagram schematically showing a failure analysis method according to Conventional Example 1.

FIG. 5 is an outline diagram schematically showing a failure analysis method according to Conventional Example 2.

PREFERRED MODES OF THE INVENTION

Figure 2:
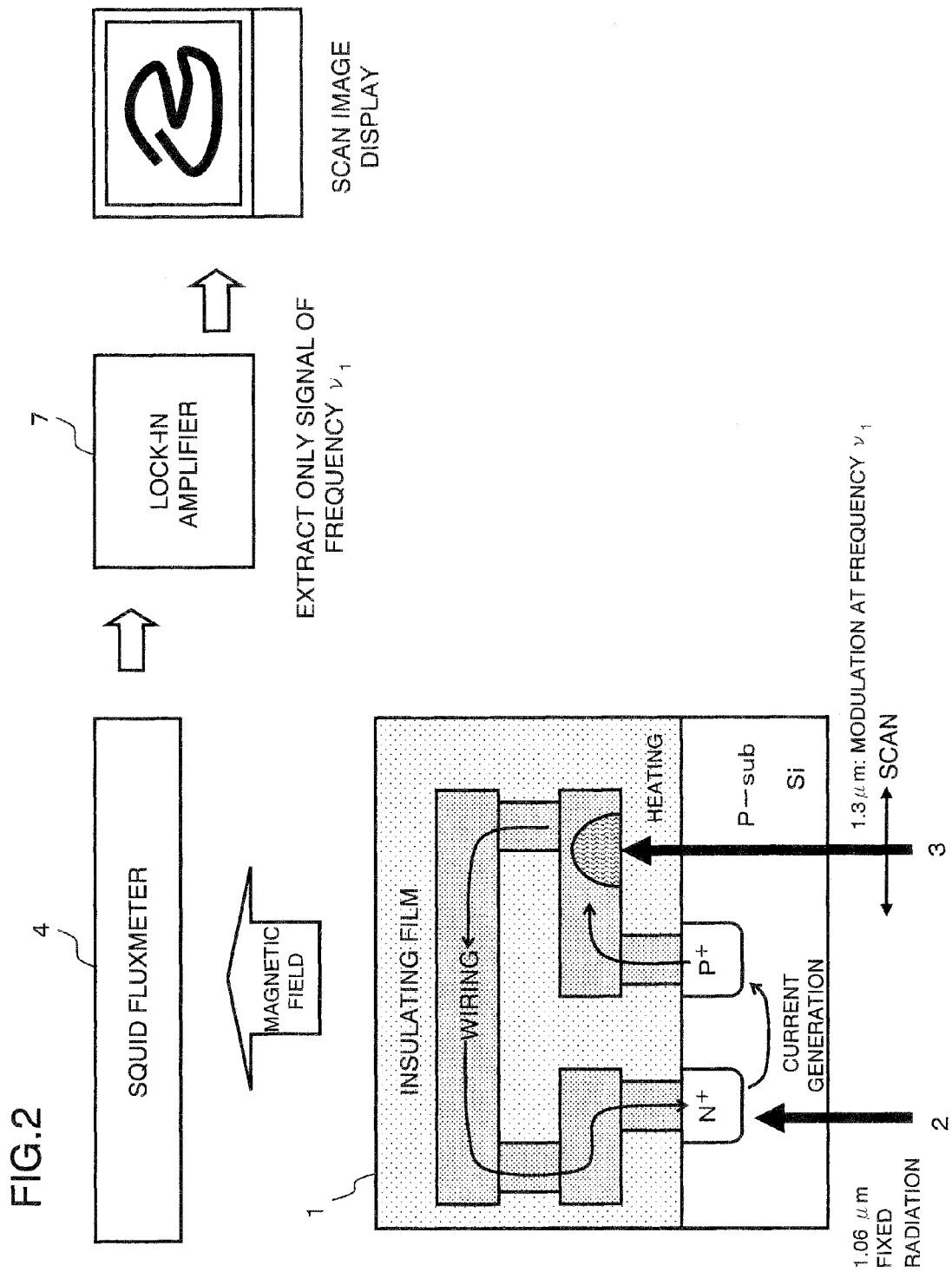
FIG. 2 is an outline diagram schematically showing the failure analysis method according to Exemplary Embodiment 2 of the present invention.

In a failure analysis method of the present invention a magnetic sensor is preferably a SQUID fluxmeter.

In the failure analysis method of the present invention, in fixed radiation of a photocurrent generation laser beam, it is preferable to perform radiation of (directed to) a p-n junction of the semiconductor chip or wafer.

In the failure analysis method of the present invention, it is preferable that the photocurrent generation laser beam permeates a substrate of the semiconductor chip or wafer and is in a wavelength region in which a photocurrent is generated at the p-n junction, and that the heating laser beam permeates the substrate of the semiconductor chip or wafer and is in a wavelength region in which wiring is heated without a photocurrent being generated at the p-n junction.

In the failure analysis method of the present invention, it is preferable that the photocurrent generation laser beam has a wavelength of, e.g. 1.06 μm, and that the heating laser beam has a wavelength of, e.g. 1.3 μm.

In the failure analysis method of the present invention, it is preferable that radiation of the photocurrent generation laser beam and the heating laser beam be performed from a back surface side of the semiconductor chip or wafer, and that detection by the magnetic sensor be performed at a front surface side of the semiconductor chip or wafer.

In the failure analysis method of the present invention, it is preferable that the magnetic sensor detects a magnetic field produced by current generated by (in and/or on) the semiconductor chip or wafer, by radiation of the photocurrent generation laser beam and the heating laser beam.

In the failure analysis method of the present invention, it is preferable that in analysis of failure of the semiconductor chip or wafer, image processing is performed in which a signal outputted from the magnetic sensor is made to correspond (or mapped) to a scanning point.

In the failure analysis method of the present invention, it is preferable that in analysis of failure of the semiconductor chip or wafer, only a signal of a prescribed frequency in signals outputted from the magnetic sensor at a lock-in amplifier be extracted, and that image processing be performed based on the extracted signal of the prescribed frequency.

In a failure analysis apparatus of the present invention, the magnetic sensor is preferably a SQUID fluxmeter.

In the failure analysis apparatus of the present invention, it is preferable that a lock-in amplifier be provided, which outputs an intensity signal, obtained by extracting only the signal of the prescribed frequency, based on a magnetic field signal corresponding to a signal detected by the magnetic sensor.

In the failure analysis apparatus of the present invention, it is preferable that a pulse generator which generates a modulation signal and a reference signal be provided, that the heating laser outputs a heating laser beam to which modulation has been applied based on the modulation signal from the pulse generator, and that the lock-in amplifier outputs a phase signal based on the reference signal from the pulse generator.

In the failure analysis apparatus of the present invention, it is preferable that a system-control system be provided which generates an image display signal based on the phase signal and the intensity signal from the lock-in amplifier.

EXEMPLARY EMBODIMENT 1

An explanation will be given using the drawings concerning a failure analysis method according to Exemplary Embodiment 1 of the present invention. FIG. 1 is an outline diagram schematically showing the failure analysis method according to Exemplary Embodiment 1 of the present invention.

The failure analysis method according to Exemplary Embodiment 1 relates to a method of non-destructively focusing (target-narrowing) upon a location suspected of failure in a semiconductor chip or wafer, to the order of microns; a photocurrent generation laser beam 2 and a heating laser beam 3 are radiated from a back side (or onto a back surface) of an LSI chip 1 (or an LSI wafer), and a SQUID fluxmeter 4 is disposed on a front side of the LSI chip 1. The photocurrent generation laser beam 2 performs one-point fixed radiation on a p-n junction close to the front surface of the LSI chip 1 (for example, refer to FIG. 2). The heating laser beam 3 scans and radiates a region to be observed. The SQUID fluxmeter 4 detects a magnetic field generated by a current (current change) generated in the LSI chip 1 by radiation, and outputs a signal based on the detected flux. In the flux detection of the SQUID fluxmeter 4, since current change of the LSI chip 1 is being watched when the heating laser beam 3 is being radiated, it is possible to detect not only a current path 5, but also a defect 6. By performing image processing in which a signal outputted from the SQUID fluxmeter 4 is made to correspond to a scanning point, it is possible to obtain a scan image.

According to Exemplary Embodiment 1, since the photocurrent generation laser beam 2 is used in current generation and an output signal of the SQUID fluxmeter 4 is used in the signal for the scan image, a terminal connection to the outside (constant voltage source, current change detection measuring device) becomes unnecessary, and disadvantages of Conventional Example 1 (refer to FIG. 4) are overcome.

Moreover, since spatial resolution of the scan image is determined by beam diameter of the heating laser beam 3, according to Exemplary Embodiment 1, submicron-unit resolution power is obtained, and a first shortcoming (the fact that spatial resolution is bad) of Conventional Example 2 (refer to FIG. 5) is overcome.

Furthermore, according to Exemplary Embodiment 1, since current change when the heating laser beam 3 is radiated is being watched, visualization of not only the current path 5 but also the defect 6 is possible, and a second shortcoming (the fact that defects cannot be seen) of Conventional Example 2 (refer to FIG. 5) is overcome.

EXEMPLARY EMBODIMENT 2

An explanation will be given using the drawings concerning a failure analysis method according to Exemplary Embodiment 2 of the present invention. FIG. 2 is an outline diagram schematically showing the failure analysis method according to Exemplary Embodiment 2 of the present invention.

In the failure analysis method according to Exemplary Embodiment 2, by defining two types of laser wavelength, differences between photocurrent generation usage and heating usage are clearly and specifically shown. The fact that the photocurrent generation laser beam 2 and the heating laser beam 3 radiate from the back side (or onto the back surface) of the LSI chip 1, and that the SQUID fluxmeter 4 is disposed on the front side of the LSI chip 1 are similar to Exemplary Embodiment 1.

A laser of wavelength 1.06 μm is used in the photocurrent generation laser beam, which performs fixed radiation of a p-n junction close to a front surface of the LSI chip 1. The reason for using a laser of wavelength 1.06 μm in the photocurrent generation laser beam 2 is that Si (P-type substrate) in the LSI chip 1 is permeated and that this is a wavelength region in which a photocurrent is generated in the p-n junction.

In the heating laser beam 3 a laser of wavelength 1.3 μm is used, modulation is performed at a frequency of $v_1$, and a region to be observed is scanned. The reason for using a laser of wavelength 1.3 μm in the heating laser beam 3 is that Si (P-type substrate) in the LSI chip 1 is permeated and that this is a wavelength region in which wiring is heated without a photocurrent being generated in the p-n junction.

The SQUID fluxmeter 4 detects magnetic flux (a magnetic field) from the LSI chip 1, and outputs a signal based on the detected magnetic flux. In the flux detection of the SQUID fluxmeter 4, since current change of the LSI chip 1 when the heating laser beam 3 is radiated is being watched, detection is possible of not only the current path (5 in FIG. 1) but also a defect (6 in FIG. 1).

A signal corresponding to the flux detected by the SQUID fluxmeter 4 is inputted to a lock-in amplifier 7, and a signal of frequency $v_1$ only is extracted with respect to input signals of the lock-in amplifier 7. The reason for using the lock-in amplifier 7 is to improve S/N (signal to noise ratio). By performing image processing based on a signal of frequency $v_1$ it is possible to obtain a scan image.

According to Exemplary Embodiment 2, an effect similar to Exemplary Embodiment 1 is realized, and S/N is improved by using the lock-in amplifier 7.

EXEMPLARY EMBODIMENT 3

Figure 3:
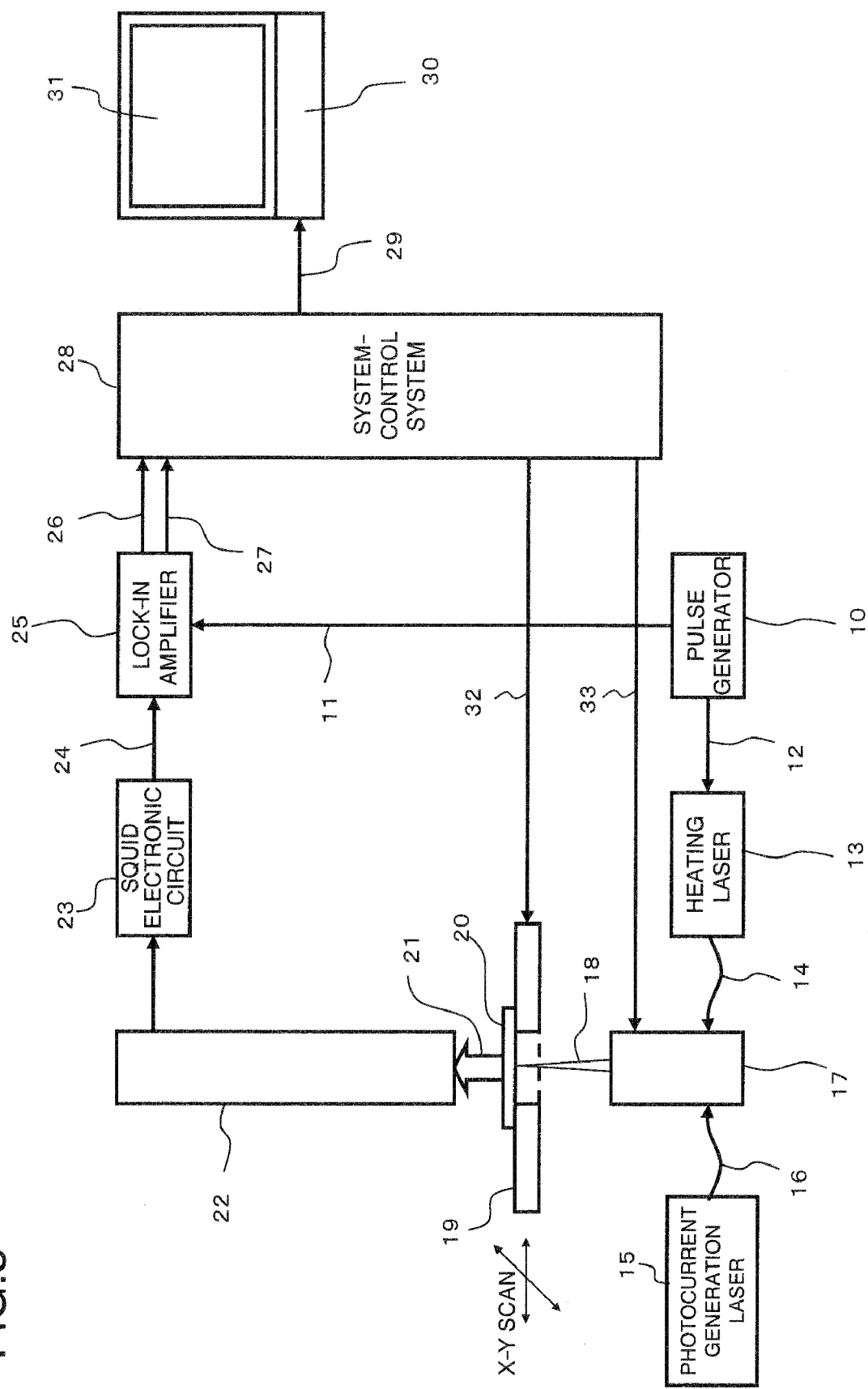
FIG. 3 is a block diagram schematically showing a configuration of a failure analysis apparatus according to Exemplary Embodiment 3 of the present invention.

An explanation will be given using the drawings concerning a failure analysis apparatus according to Exemplary Embodiment 3 of the present invention. FIG. 3 is a block diagram schematically showing a configuration of a failure analysis apparatus according to Exemplary Embodiment 3 of the present invention.

The failure analysis apparatus according to Exemplary Embodiment 3 is an apparatus that uses the failure analysis method of Exemplary Embodiments 1 and 2, and has a pulse generator 10, a heating laser 13, a photocurrent generation laser 15, an optical system 17, a specimen stage 19, a SQUID fluxmeter 22, a SQUID electronic circuit 23, a lock-in amplifier 25, a system-control system (unit) 28, a personal computer 30 and a display 31.

The pulse generator 10 is a device that generates a reference signal 11 and a modulation signal 12 forming a pulse. The heating laser 13 is a device which outputs a heating laser beam based on the modulation signal 12 from the pulse generator 10, and outputs the heating laser beam, to which modulation has been applied, towards the optical system 17 via optic fiber 14. The photocurrent generation laser 15 is a device which outputs a photocurrent generation laser beam, and outputs the photocurrent generation laser beam towards the optical system 17 via optic fiber 16.

The optical system 17 is an optical device which outputs a laser beam 18 that mixes two types of laser beams, based on the inputted photocurrent generation laser beam and the heated laser beam, towards a back surface of a sample 20 (LSI chip or LSI wafer). The optical system 17 determines the position (or perform positioning) of "one point" based on a laser scanning signal 33 from the system-control systems 28 and performs one-point fixed radiation, to a back surface of the sample 20, of the photocurrent generation laser beam from the photocurrent generation laser 15 of the laser beam 18. The optical system 17 radiates onto the back surface of the sample 20, while scanning, based on a laser scanning signal 33 from the system-control system 28, the heating laser beam from the heating laser 13, (as a part) of the laser beam 18.

The specimen stage 19 is a stage for mounting (placing) the sample 20, and X-Y scan is possible based on a stage scanning signal 32 from the system-control system 28.

The SQUID fluxmeter 22 is a measuring device which detects, on a back surface side of the sample 20, a magnetic field 21 produced by current generated in the sample 20 by radiation, and outputs the detected signal towards a SQUID electronic circuit 23. The SQUID electronic circuit 23 is an electronic circuit that generates a magnetic field signal 24 based on a signal from the SQUID fluxmeter 22, and outputs the generated magnetic field signal 24 towards the lock-in amplifier 25.

The lock-in amplifier 25, based on the inputted reference signal 11 and the magnetic field signal 24, outputs a phase signal 26 (a signal representing a phase difference between the reference signal 11 and the magnetic field signal 24) and an intensity signal 27 obtained by extracting a signal of frequency $v_1$, towards the system-control system 28.

The system-control system 28 is a device which controls each component part within the failure analysis apparatus. The system-control system 28 generates an image display signal 29 based on the phase signal 26 and the intensity signal 27 from the lock-in amplifier 25, and outputs the generated image display signal 29 towards the personal computer 30. The system-control system 28 outputs a stage scanning signal 32 formed of a control signal of position output or X-Y scan of the specimen stage 19. The system-control system 28 outputs a laser scanning signal 33 formed of position output of the photocurrent generation laser beam, position output of the heating laser beam, and the control signal of the X-Y scan, towards the optical system 17.

The personal computer 30 displays an intensity image and a phase image on the display 31 based on an image display signal 29 from the system-control system 28.

According to Exemplary Embodiment 3, an effect similar to Exemplary Embodiments 1 and 2 is realized, and by using not only the intensity image but also the phase image, more abundant information is obtained, and it is possible to improve sensitivity and performance of visualization of the current path and of defects.

Note the sample (or specimen) may be either a semiconductor chip (or chips) or a wafer (or wafers) bearing a plurality of semiconductor chips throughout the exemplary embodiments.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A failure analysis method comprising:
   performing fixed radiation of a semiconductor chip or wafer by a photocurrent generation laser beam;
   scanning and radiating a region to be observed on said semiconductor chip or wafer by a heating laser beam;
   detecting, by a magnetic sensor, current change generated in said semiconductor chip or wafer by radiating said photocurrent generation laser beam and said heating laser beam; and
   analyzing a failure of said semiconductor chip or wafer based on said current change detected by said magnetic sensor.

2. The failure analysis method according to claim 1, wherein said magnetic sensor is a SQUID fluxmeter.

3. The failure analysis method according to claim 1, wherein, in said fixed radiation of said photocurrent generation laser beam, a p-n junction of said semiconductor chip or wafer is radiated.

4. The failure analysis method according to claim 1, wherein said photocurrent generation laser beam permeates a substrate of said semiconductor chip or wafer and is in a wavelength region in which a photocurrent is generated at a p-n junction, and said heating laser beam permeates a substrate of said semiconductor chip or wafer and is in a wavelength region in which wiring is heated without a photocurrent being generated at a p-n junction.

5. The failure analysis method according to claim 4, wherein said photocurrent generation laser beam has a wavelength of 1.06 μm, and said heating laser beam has a wavelength of 1.3 μm.

6. The failure analysis method according to claim 1, wherein radiation of said photocurrent generation laser beam and said heating laser beam is performed from a back surface side of said semiconductor chip or wafer, and detection by said magnetic sensor is performed at a front surface side of said semiconductor chip or wafer.

7. The failure analysis method according to claim 1, wherein said magnetic sensor detects a magnetic field produced by current generated by said semiconductor chip or wafer, by radiation of said photocurrent generation laser beam and said heating laser beam.

8. The failure analysis method according to claim 1, wherein, in analysis of failure of said semiconductor chip or wafer, image processing is performed in which a signal outputted from said magnetic sensor is made to correspond (or mapped) to a scanning point.

9. The failure analysis method according to claim 8, further comprising displaying said region to be observed and possible defects of said region using said image processing.

10. The failure analysis method according to claim 1, wherein, in analysis of failure of said semiconductor chip or wafer, only a signal of a prescribed frequency in signals outputted from said magnetic sensor at a lock-in amplifier is extracted, and image processing is performed based on the extracted signal of a prescribed frequency.

11. The failure analysis method according to claim 1, wherein said heating laser beam is in a wavelength region in which a photocurrent is not generated in said region to be observed.

12. A failure analysis apparatus, comprising:
   a heating laser which outputs a heating laser beam;
   a photocurrent generation laser which outputs a photocurrent generation laser beam;
   an optical system which outputs a mixed (or combined) laser beam, in which said photocurrent generation laser beam and said heating laser beam that have been inputted are mixed, towards a back surface of a sample formed of a semiconductor chip or wafer; and
   a magnetic sensor which detects, at a front surface side of said sample, a magnetic field produced by a current generated by said sample by radiation of said mixed laser beam;
   wherein said optical system outputs a position of said photocurrent generation laser beam of said mixed laser beam based on a control signal and performs fixed radiation onto a back surface of said sample, and scans said heating laser beam of said mixed laser beam, to radiate the back surface of said sample with said heating laser beam of said mixed laser beam based on the control signal.

13. The failure analysis apparatus according to claim 12, wherein said magnetic sensor is a SQUID fluxmeter.

14. The failure analysis apparatus according to claim 12, comprising: a lock-in amplifier which outputs an intensity signal obtained by extracting only a signal of a prescribed frequency, based on a magnetic field signal corresponding to a signal detected by said magnetic sensor.

15. The failure analysis apparatus according to claim 12, comprising: a pulse generator which generates a modulation signal and a reference signal; wherein said heating laser outputs a heating laser beam to which modulation has been applied based on said modulation signal from said pulse generator, and said lock-in amplifier outputs a phase signal based on said reference signal from said pulse generator.

16. The failure analysis apparatus according to claim 12, comprising: a system-control system which generates an image display signal based on said phase signal and said intensity signal from said lock-in amplifier.

17. The failure analysis apparatus according to claim 16, further comprising an image display device coupled to said lock-in amplifier providing images of a current path of said sample and possible defects of said current path.

18. The failure analysis apparatus according to claim 12, wherein said magnetic sensor is a SQUID fluxmeter; and said apparatus further comprises:
   a lock-in amplifier which outputs an intensity signal obtained by extracting only a signal of a prescribed frequency, based on a magnetic field signal corresponding to a signal detected by said magnetic sensor;
   a pulse generator which generates a modulation signal and a reference signal;
   wherein said heating laser outputs a heating laser beam to which modulation has been applied based on said modulation signal from said pulse generator, and said lock-in amplifier outputs a phase signal based on said reference signal from said pulse generator.

19. The failure analysis apparatus according to claim 12, wherein said heating laser beam is in a wavelength region in which a photocurrent is not generated in said sample.

* * * * *